(12) United States Patent
Franke et al.

(10) Patent No.: US 6,448,622 B1
(45) Date of Patent: Sep. 10, 2002

(54) POLYCRYSTALLINE SILICON-GERMANIUM FILMS FOR MICRO-ELECTROMECHANICAL SYSTEMS APPLICATION

(75) Inventors: Andrea Franke, Oakland; Roger T. Howe, Martinez; Tsu-Jae King, Fremont, all of CA (US)

(73) Assignee: The Regents of the University of California, Berkeley, CA (US)

( * ) Notice: Subject to any disclaimer, the term of this patent is extended or adjusted under 35 U.S.C. 154(b) by 0 days.

(21) Appl. No.: 09/617,300

(22) Filed: Jul. 17, 2000

Related U.S. Application Data

(62) Division of application No. 09/483,222, filed on Jan. 14, 2000, now Pat. No. 6,210,988.
(60) Provisional application No. 60/116,024, filed on Jan. 15, 1999.

(51) Int. Cl.$^7$ ............................................. H01L 29/82
(52) U.S. Cl. .................. 257/415; 257/414; 257/616; 438/50; 438/53
(58) Field of Search ..................... 438/50, 53; 257/414, 257/415, 416

(56) References Cited

U.S. PATENT DOCUMENTS

| | | | |
|---|---|---|---|
| 3,861,024 A | 1/1975 | Napoli et al. ................ 438/301 |
| 5,025,346 A | 6/1991 | Tang et al. ............... 361/283.1 |
| 5,190,637 A | 3/1993 | Guckel ........................ 205/118 |
| 5,440,152 A | 8/1995 | Yamazaki ................... 257/197 |
| 5,491,604 A | * 2/1996 | Nguyen et al. .............. 361/278 |
| 5,537,083 A | 7/1996 | Lin et al. ..................... 333/186 |
| 5,569,968 A | * 10/1996 | Lal et al. ..................... 310/322 |
| 5,576,251 A | * 11/1996 | Garabedian et al. ........... 438/53 |
| 5,651,900 A | 7/1997 | Keller et al. ................... 216/56 |
| 5,660,680 A | 8/1997 | Keller .......................... 438/50 |
| 5,839,062 A | 11/1998 | Nguyen et al. ............. 455/323 |
| 5,919,364 A | 7/1999 | Lebouitz et al. ........ 210/321.84 |
| 6,033,974 A | 3/2000 | Henley et al. ............... 438/526 |
| 6,064,081 A | 5/2000 | Robinson et al. ........... 257/183 |

FOREIGN PATENT DOCUMENTS

JP         05095122 A    * 4/1993    .................. 257/108

OTHER PUBLICATIONS

Sedky et al., Structural and Mechanical Properties of Polycrystalline Silicon Germanium for Micromachining Applications, Dec. 1998, IEEE Journal of Microelectromechanical Systems, v. 7, No. 4, p. 365–372.*

Sedky et al., "Thermally Insulated Structures for IR Bolometers, Made of Polycrystalline Silicon Germanium Alloys", Int. Conf. on solid State Sensors and Actuators, 1997, Chicago, Jun. 16–19, 1997, pp. 237–240.

Li et al., "Applications of Germanium to Low Temperature Micro–Machining", 12fth IEEE International conference on Micro Electro Mechanical Systems, Orlando, Florida, Jan. 17–21, 1999, 638–643.

Lee et al., "Electrical characterization of Si/Si–Ge quantum well wires fabricated by low damage CFsub 4 reactive ion etching", MicroElectronic Engineering, 1997, pp. 33–36.

Sedky et al., "Structural and Mechanical Properties of Polycrystalline Silicon Germanium for Micromachining Applications", Journal of Microelectromechanical Systems, vol. 7, Dec. 1998, pp. 365–372.

Maboudian, "Surface processes in MEMS technology", Surface Science Reports, vol. 30, 1998, pp. 207–269.

* cited by examiner

Primary Examiner—Nathan Flynn
Assistant Examiner—Scott R Wilson
(74) Attorney, Agent, or Firm—Fish & Richardson P.C

(57) ABSTRACT le;.5qThis invention relates to micro-electromechanical systems using silicon-germanium films. Such a system includes one or more layers of $Si_{1-x}Ge_x$, deposited on a substrate, where $0<x\leq 1$. One or more transistors can be formed on the substrate.

13 Claims, 9 Drawing Sheets

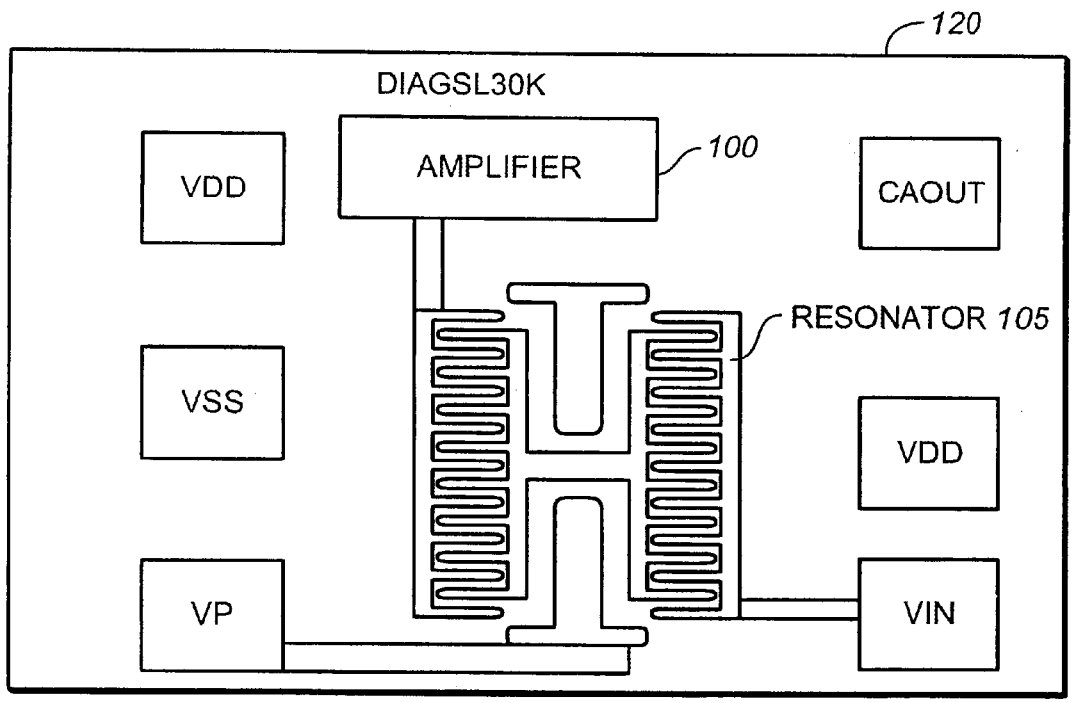
FIG._1A
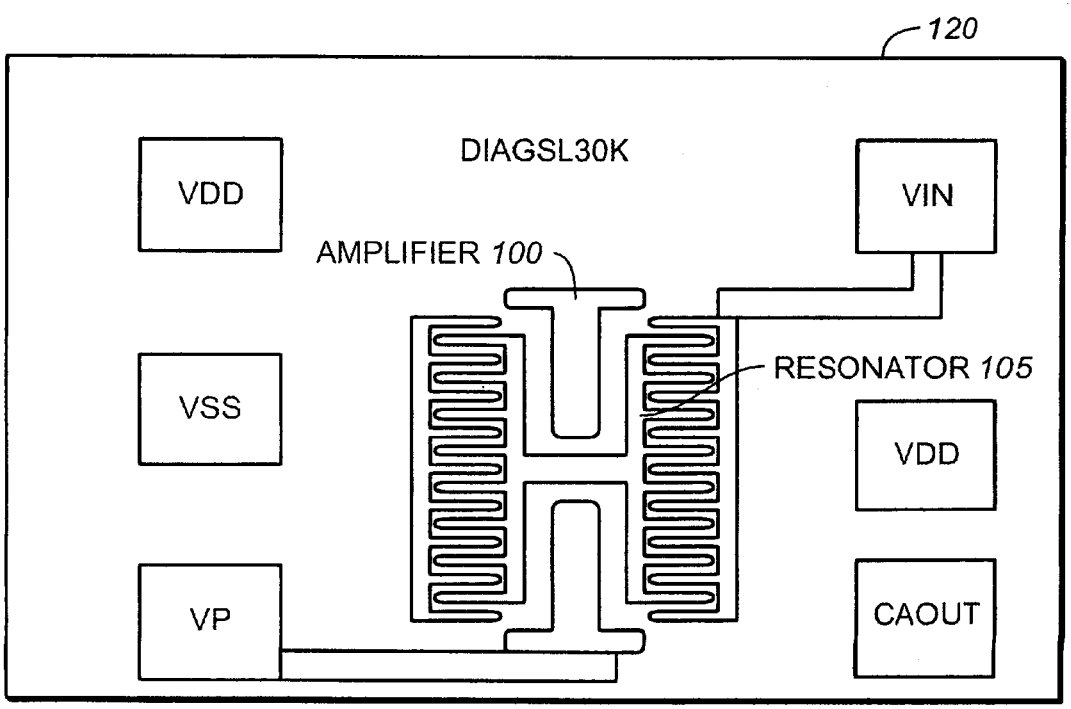
FIG._1B

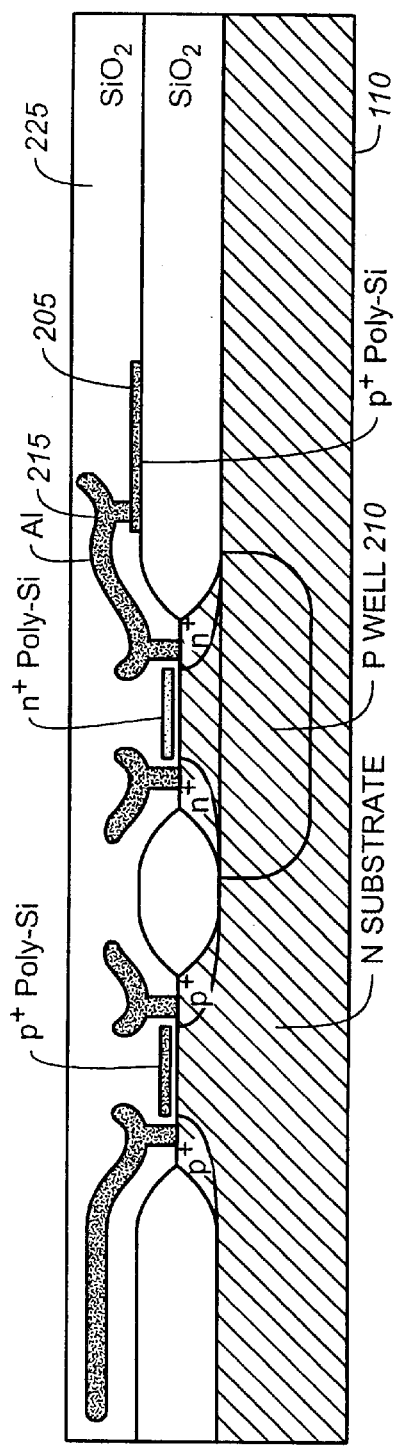
FIG._2
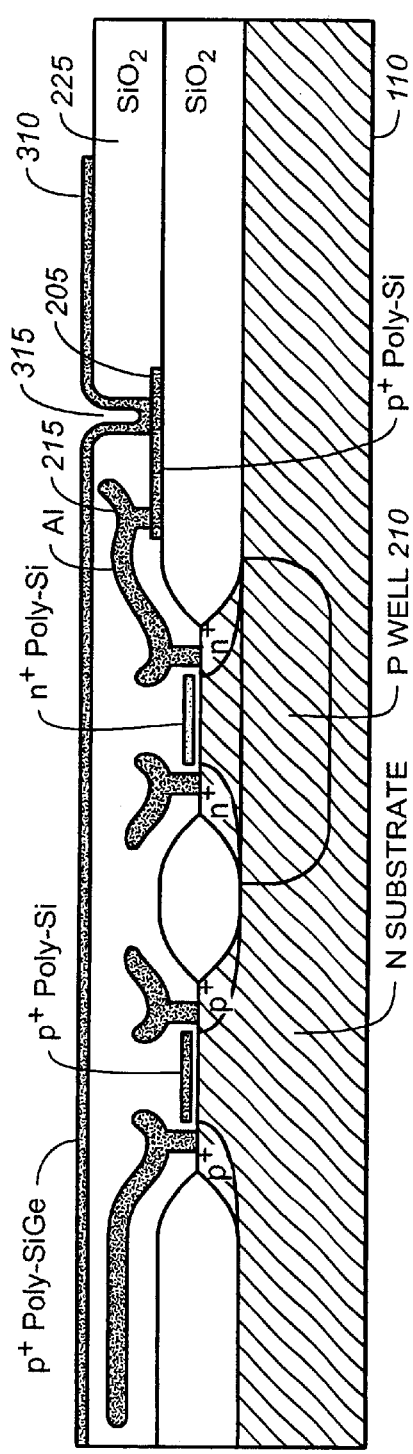
FIG._3

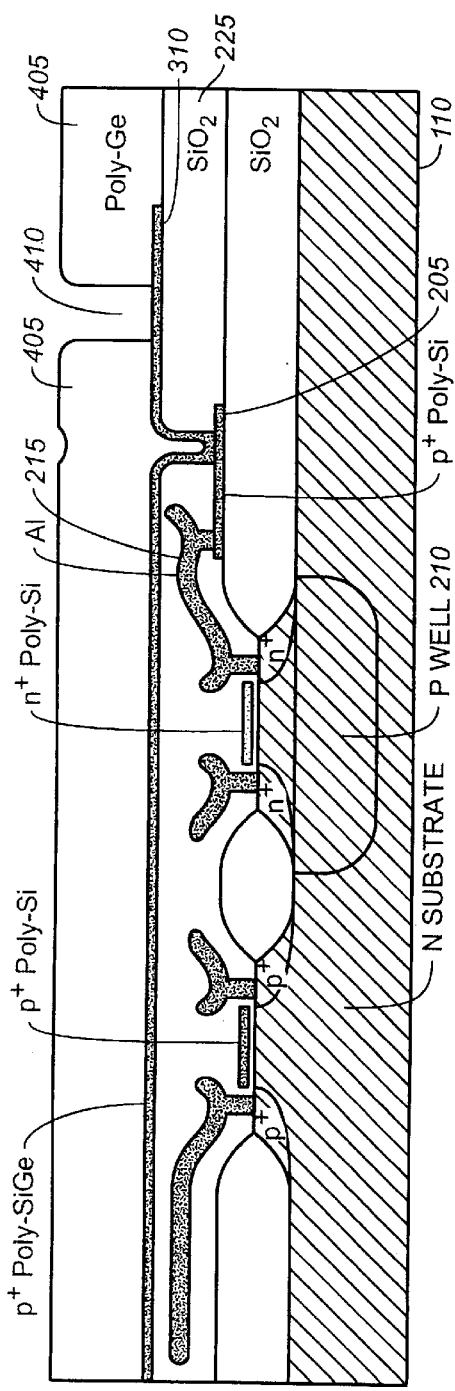
FIG._4
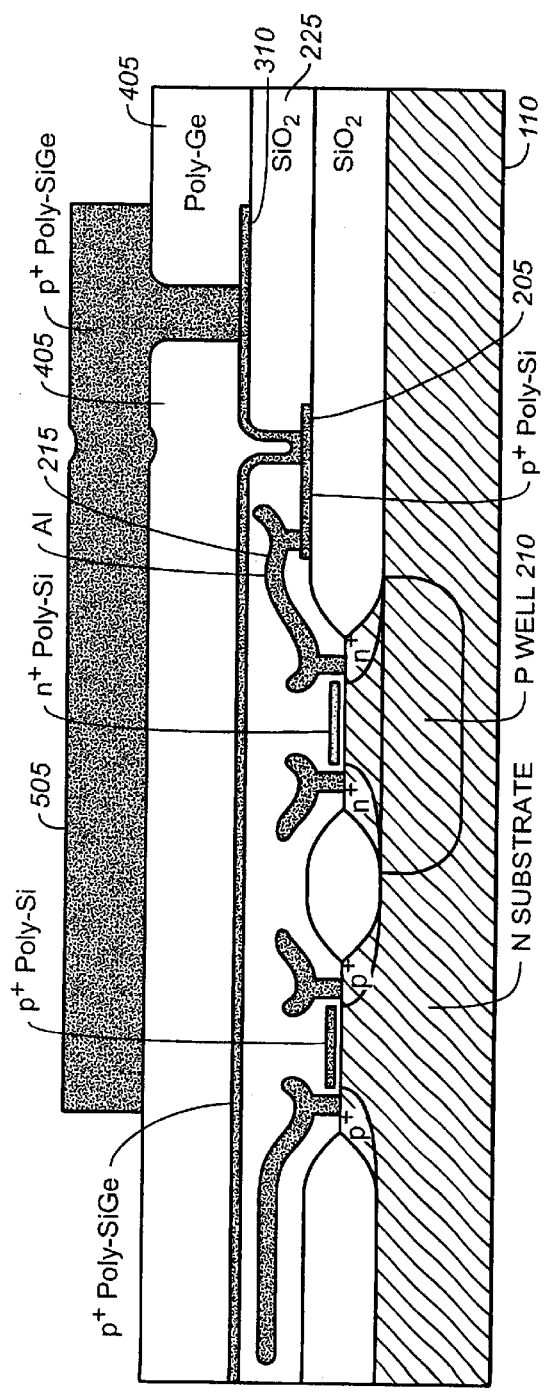
FIG._5

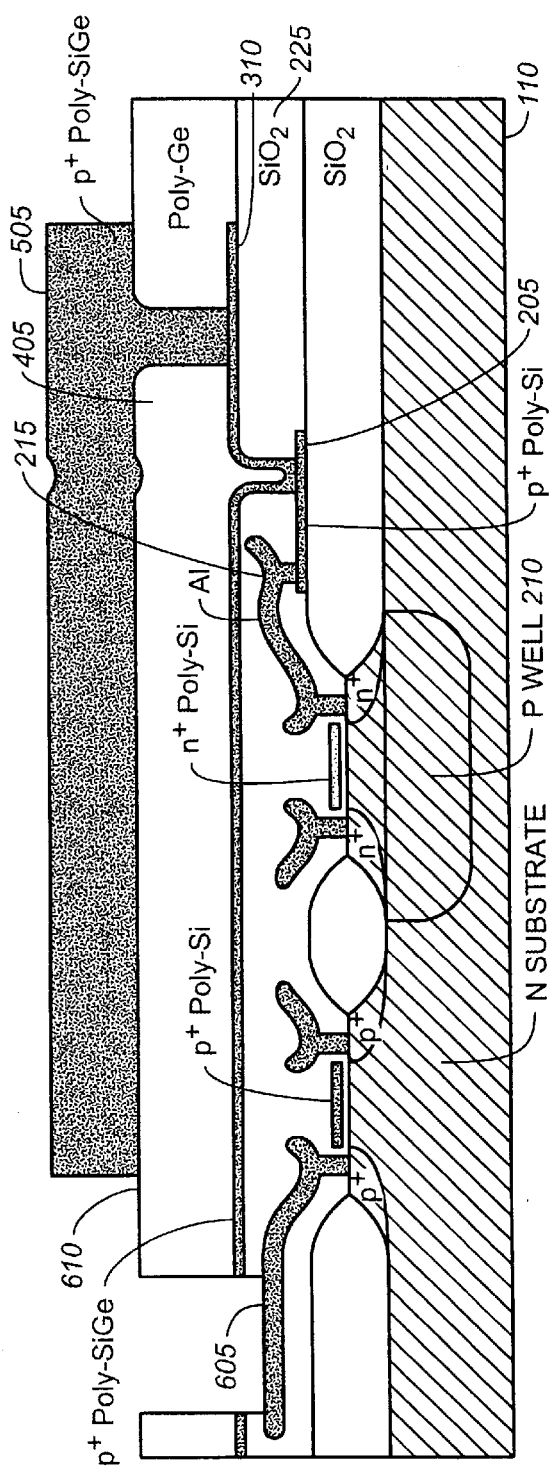
FIG._6
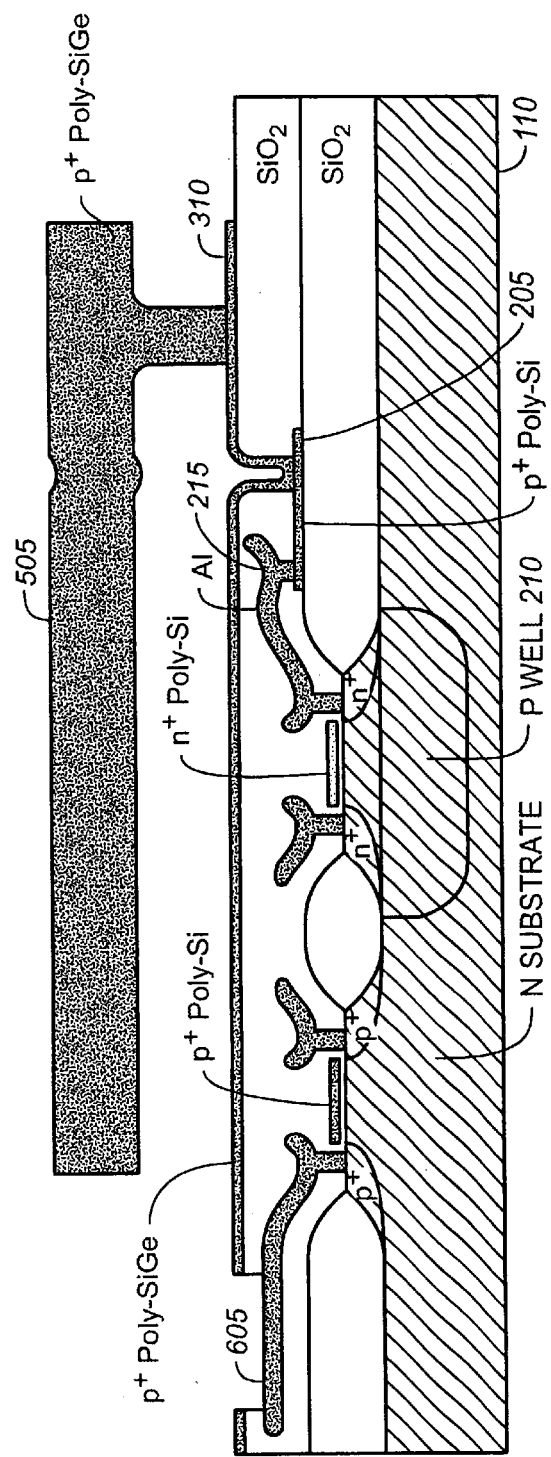
FIG._7

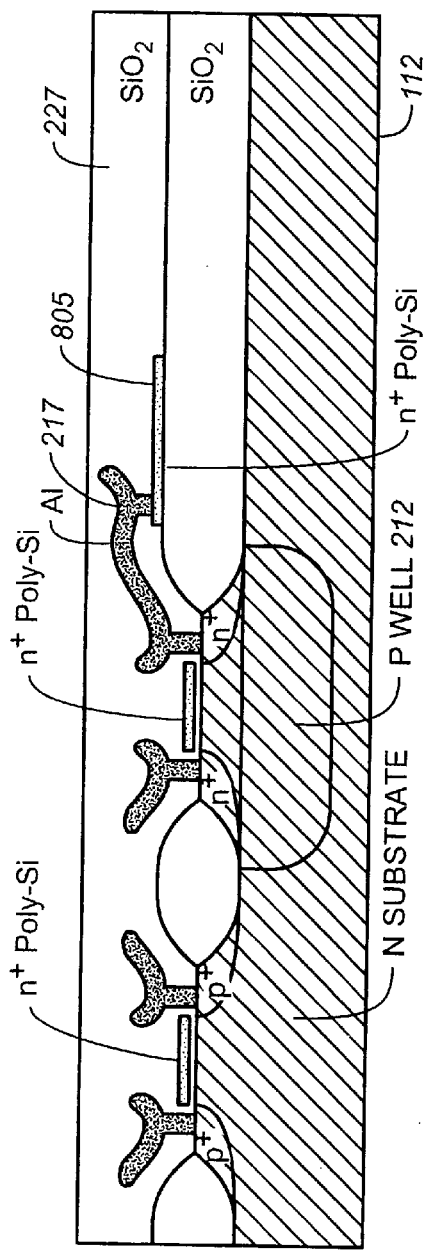
FIG._8
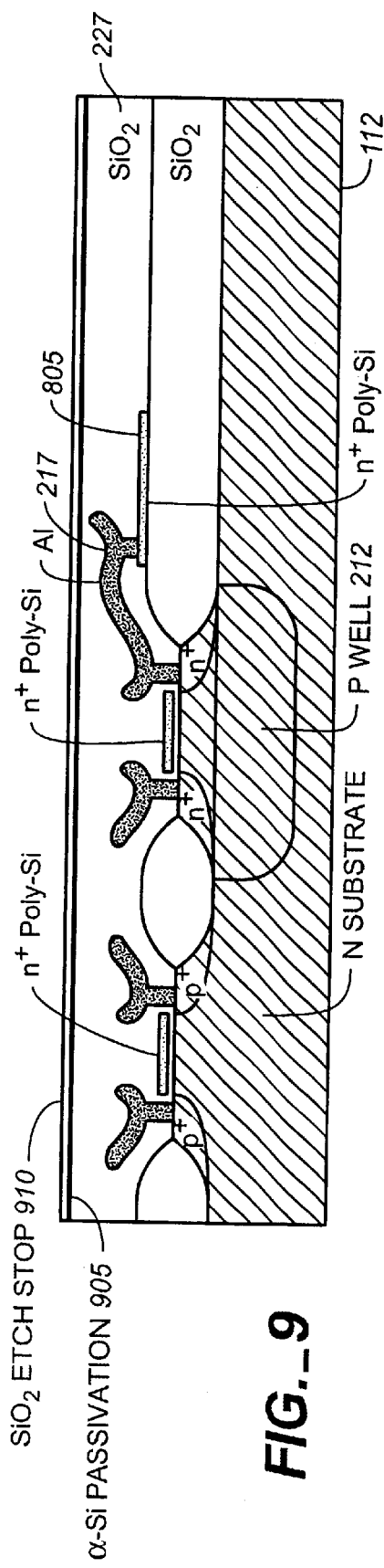
FIG._9

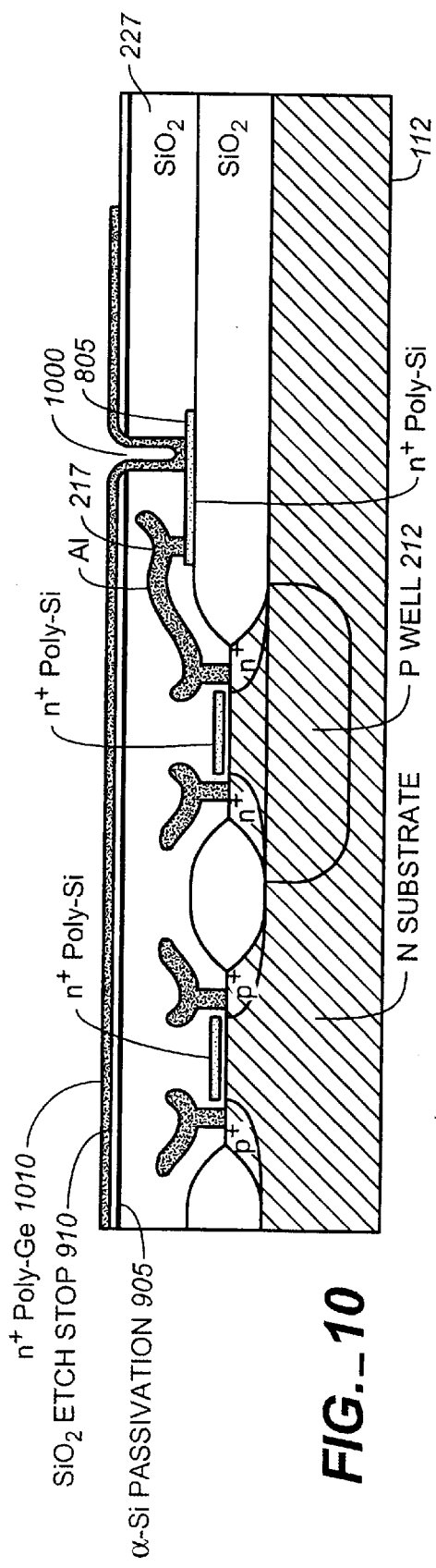
FIG._10
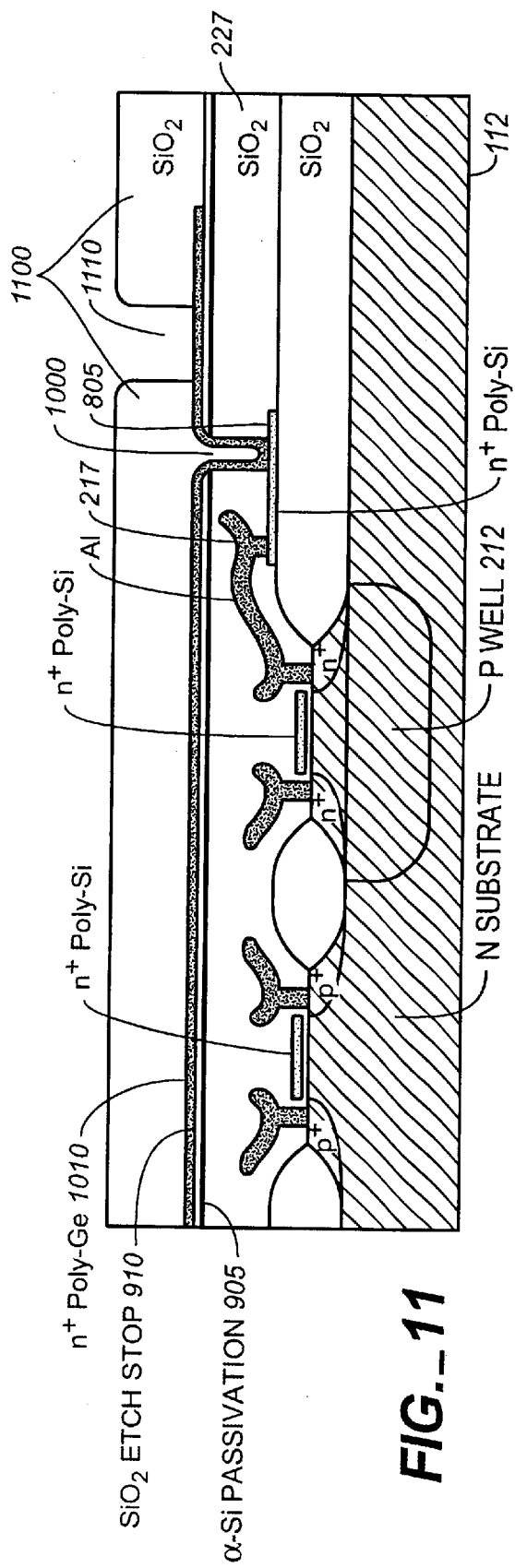
FIG._11

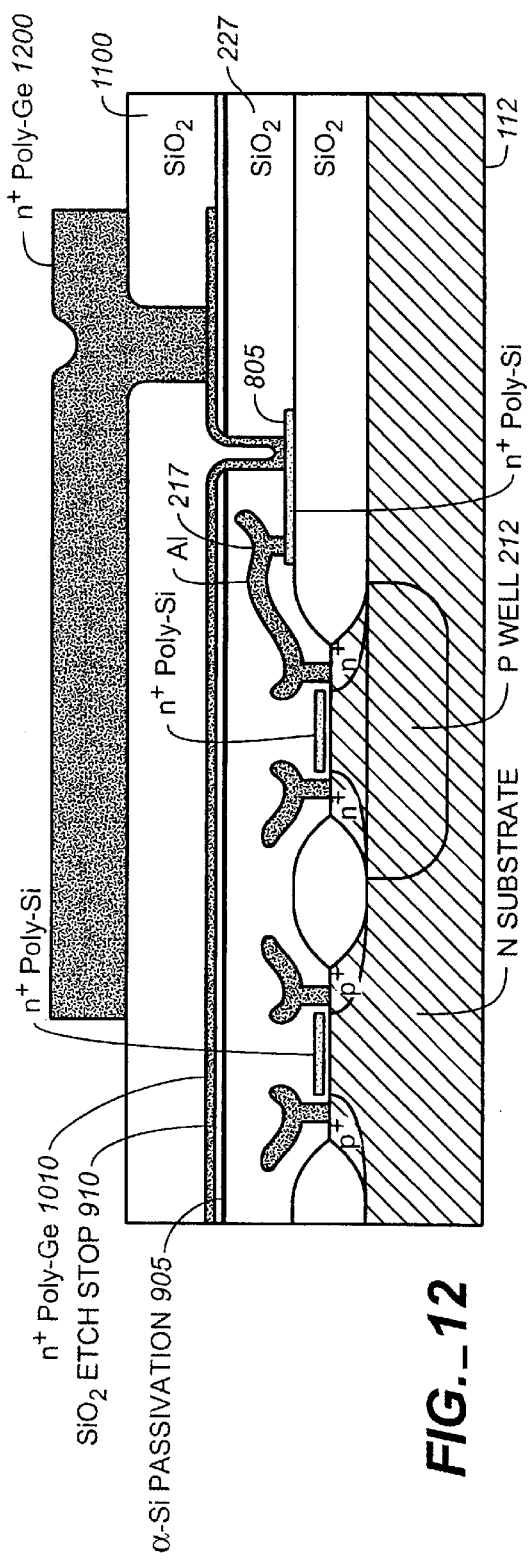
FIG._12
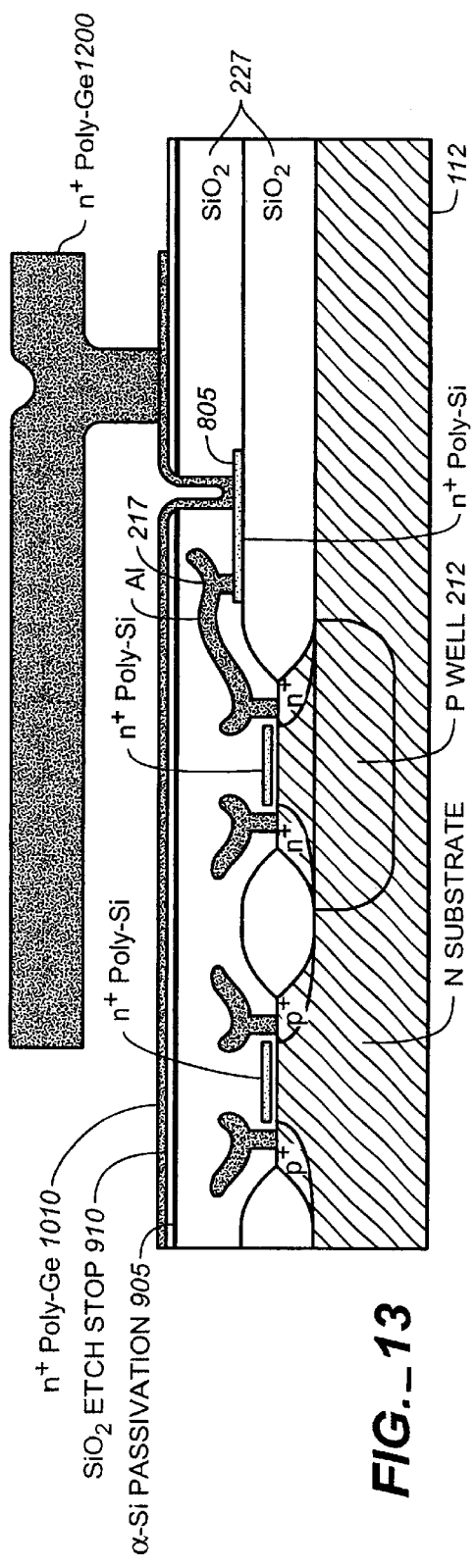
FIG._13

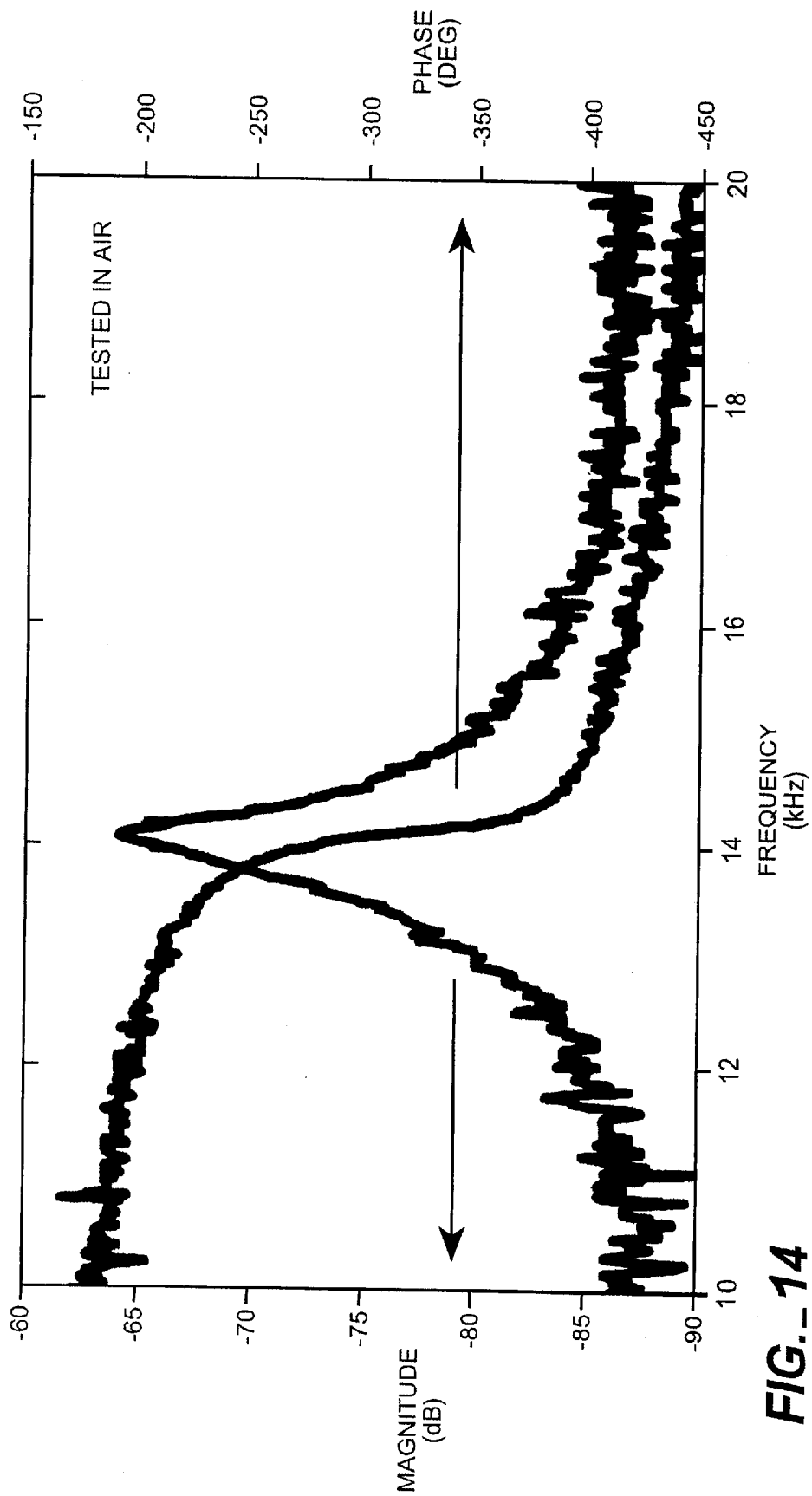
FIG._14

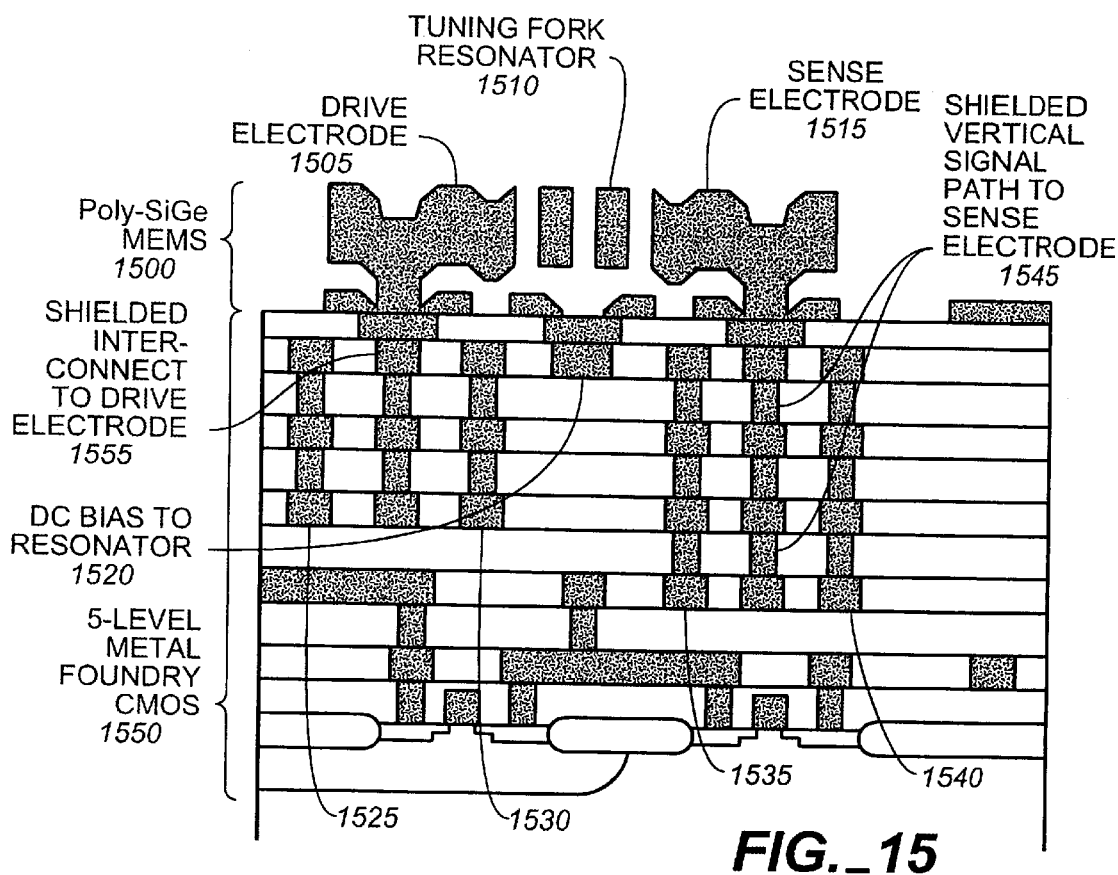
FIG._15
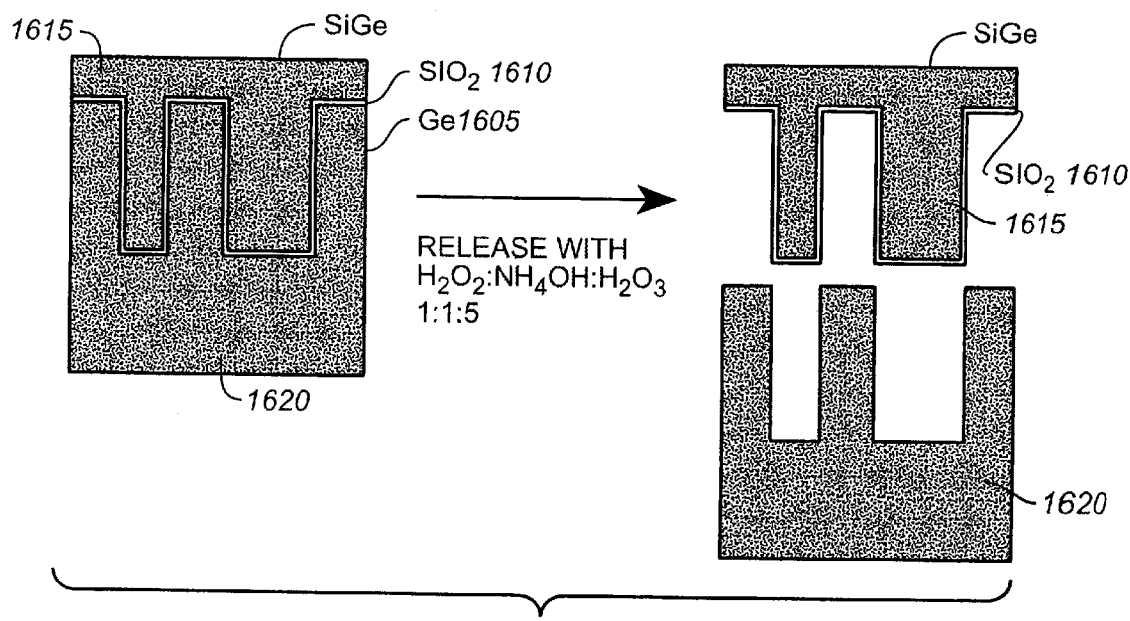
FIG._16

POLYCRYSTALLINE SILICON-GERMANIUM FILMS FOR MICRO-ELECTROMECHANICAL SYSTEMS APPLICATION

CROSS-REFERENCE TO RELATED APPLICATIONS

This application is a divisional (and claims the benefit of priority under 35 USC 120) of U.S. application Ser. No. 09/483,222, filed Jan. 14, 2000 now U.S. Pat. No. 6,210,988, which claims the benefit of U.S. Provisional Application No. 60/116,024, filed Jan. 15, 1999, both of which are incorporated herein by reference.

BACKGROUND

This invention relates to micro-electromechanical systems (MEMS), and more particularly to the fabrication of microstructures using structural and sacrificial films.

Surface micromachining is the fabrication of thin-film microstructures by the selective removal of a sacrificial film. Since the 1980s, polycrystalline silicon (poly-Si), deposited by low-pressure chemical vapor deposition (LPCVD), has become established as an important microstructural material for a variety of applications. Silicon dioxide ($SiO_2$) is typically used for the sacrificial layer and hydrofluoric acid (HF) is used as the selective "release" etchant in poly-Si micromachining. The successful application of poly-Si to inertial sensors, for example, is owing to the excellent mechanical properties of poly-Si films and to the widespread availability of deposition equipment for poly-Si and $SiO_2$ films, both of which are standard materials for integrated-circuit fabrication.

Co-fabrication of surface microstructures and microelectronic circuits in a modular fashion is advantageous in many cases, from the perspectives of system performance and cost. Given the maturity of the microelectronics industry and the complexity and refinement of integrated-circuit processes, it is highly desirable if the MEMS can be fabricated after completion of the electronic circuits with conventional mettallization, such as aluminum (Al) metallization. While this "MEMS-last" strategy is infeasible for poly-Si microstructures because the deposition and stress-annealing temperatures for poly-Si films are much too high for aluminum or copper interconnects to survive, the MEMS-last strategy is nonetheless very desirable.

The state-of-the-art poly-Si integration strategy is to fabricate the thin-film stack of structural and sacrificial films prior to starting the electronic circuit process. There are several practical disadvantages to this "MEMS-first" approach. First, the highly tuned and complex electronics process may be adversely affected by the previous MEMS deposition, patterning, and annealing steps. For this reason, commercial electronics foundries are unlikely to accept the pre-processed wafers as a starting material. Second, the planarity of the wafer surface must be restored after completion of the MEMS thin-film stack, which can be accomplished by fabricating the MEMS in a micromachined well or by growing additional silicon through selective epitaxy. Third, the release of the structure occurs at the end of the electronics process and the electronic circuits must be protected against the hydrofluoric acid etchant. Finally, the MEMS-first approach requires that the MEMS and electronics be located adjacent to each other, with electrical interconnections that contribute significant parasitic resistance and capacitance and thereby degrade device performance.

SUMMARY

In one aspect, the invention features a process for forming a micro-electromechanical system on a substrate. The process includes depositing a sacrificial layer of silicon-germanium onto the substrate; depositing a structural layer of silicon-germanium onto the sacrificial layer, where the germanium content of the sacrificial layer is greater than the germanium content of the structural layer; and removing at least a portion of the sacrificial layer.

In another aspect, the invention is directed to a process for forming a micro-electromechanical system. The process includes depositing onto a substrate a sacrificial layer of silicon oxide; depositing onto the sacrificial layer a structural layer of $Si_{1-x}G_x$, where $0<x\leq1$, at a temperature of about 650° C. or less; and removing at least a portion of the sacrificial layer.

In yet another aspect, the invention is directed to a process which for forming a micro-electromechanical system, comprising the steps of depositing onto a substrate a sacrificial layer of polycrystalline germanium; depositing onto the sacrificial layer a structural layer of $Si_{1-x}Ge_x$, where $0<x\leq1$ at a temperature of about 650° C. or less; and removing at least a portion of the sacrificial layer.

In another aspect, the invention is directed to a process which includes depositing a ground plane layer of $Si_{1-x}Ge_x$, where $0.6<x<0.8$; depositing onto the ground plane layer a sacrificial layer; depositing onto the sacrificial layer a structural layer of $Si_{1-x}Ge_x$, where $0<x\leq1$, at a temperature of about 650° C. or less; and removing at least a portion of the sacrificial layer.

Various implementations of the invention may include one or more of the following features. The process may form one or more transistors on the substrate where the transistors are formed before the sacrificial and structural layers are deposited onto the substrate. The transistors may be formed using Cu metallization or Al metallization. The transistors may be formed without metallization before the sacrificial and structural layers are deposited onto the substrate and are metalized after the sacrificial and structural layers are deposited. The transistors may be MOS transistors or bipolar transistors.

The sacrificial layer may be composed of $Si_{1-x}G_x$, where $0.4\leq x\leq1$. The sacrificial layer and the structural layer may be deposited at a temperature of about 550° C. or less. The germanium concentration of the structural layer may vary through its depth. The process may remove portions of the structural layer to achieve a desired three-dimensional shape. The sacrificial layer may be completely removed. The sacrificial layer may be removed by exposing it to a solution comprising hydrogen peroxide, ammonium hydroxide, and water, or HF. Before the sacrificial layer is exposed to HF, amorphous silicon may be deposited on the substrate.

In another aspect, the invention is directed to a micro-electromechanical system. The system includes a substrate; one or more structural layers of $Si_{1-x}Ge_x$, formed on the substrate, where $0<x\leq1$; and one or more transistors formed on the substrate.

Various implementations of the microelectromechanical system may include one or more of the following features. The micro-electromechanical system may feature a glass or a silicon substrate. It may comprise at least portions of one or more sacrificial layers of silicon-germanium formed under structural layers, where the germanium content of the one or more sacrificial layers is greater than the germanium content of the respective structural layers. The system may also comprise at least portions of one or more sacrificial layers of silicon oxide formed under structural layers. The one or more transistors in the micro-electromechanical system may be MOS transistors or bipolar transistors.

The one or more structural layers in the microelectromechanical system are deposited above the one or more transistors. The one or more structural layers may be deposited onto an upper level of a metal interconnect of the one or more transistors. The one or more structural layers include a ground plane which is electrically connected to the upper level of the metal interconnect. The one or more structural layers may form a resonator, or may be incorporated into an optical device.

The details of one or more implementations of the invention are set forth in the accompanying drawings and the description below. Other features, objects, and advantages of the invention will be apparent from the description and drawings, and from the claims.

A principal advantage of using poly-silicon-germanium is its much lower deposition temperature than LPCVD poly-Si; furthermore, a dopant-activation and residual stress annealing step, if even necessary, can be conducted at a much lower temperature than for LPCVD poly-Si. In fact, the in situ doped, p-type poly-silicon-germanium (poly-$Si_{(1-x)}Ge_x$) does not require an annealing step, because its as-deposited resistivity, residual stress and stress gradient are sufficiently low for many MEMS applications. In situ doped p-type poly-$Si_{1-x}Ge_x$ films may be used as the structural layer, both to maximize the deposition rate and to minimize the film's resistivity. As a result, poly-silicon-germanium (poly-$Si_{(1-x)}Ge_x$) microstructures can be fabricated using a "MEMS-last" paradigm directly on top of state-of-the-art microelectronics. The initial layer of poly-SiGe can be deposited directly onto an upper-level of a metal interconnect in the electronic process. The low thermal budget does not come at the price of degraded performance: the mechanical properties of poly-$Si_{(1-x)}Ge_x$, such as the intrinisic damping parameter and fracture strain, are in the same range as those of poly-Si.

Another advantage of LPCVD poly-$Si_{(1-x)}Ge_x$ films is that they may be used for the sacrificial layers, as well as the microstructural layers. Germanium or germanium-rich poly-SiGe films are etched selectively with respect to poly-SiGe films containing at least 30 percent Si by using hydrogen peroxide ($H_2O_2$) as a release etchant. The elimination of HF as the release etchant greatly simplifies the final steps and increases the safety of the process. Hydrogen peroxide does not attack the upper layers in microelectronic structures, such as aluminum, oxides, or oxynitrides; as a result, there is no need for special masking films to protect the electronics during the release etch. The extreme selectivity of hydrogen peroxide to germanium-rich films also eliminates the need for closely spaced etch-access holes in microstructural layers. As a result, MEMS designers can create unperforated plates for such applications as micro-mirrors, where etch-access holes are undesirable.

Still another advantage is that by using poly-$Si_{(1-x)}Ge_x$ films, which enables the MEMS-last strategy, designers can access any integrated circuit (IC) foundry for the integrated-circuit portion of the system, since no modification whatsoever is needed to the microelectronics process.

SiGe promises to revolutionize MEMS technology by easing modular integration with CMOS devices, for example, using standard processing techniques, increasing process throughput and yield, improving molded microstructure (HEXSIL) fabrication, and enabling new device designs. These improvements are economically viable, since an LPCVD Si furnace can be converted to a SiGe furnace simply by adding another input gas.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1A is a top view of a MEMS resonator and a microelectronics amplifier built side-by-side.

FIG. 1B is a top view of a MEMS resonator built on top of a microelectronics amplifier.

FIGS. 2–7 are cross-sectional views illustrating steps in the fabrication of the resonator and the amplifier of FIG. 1B.

FIGS. 8–13 are cross-sectional views illustrating alternative steps in the fabrication of the resonator and the amplifier of FIG. 1B.

FIG. 14 is a graph illustrating the frequency response of a microresonator and CMOS amplifier like that of FIG. 1A.

FIG. 15 is a cross-sectional view of a resonator fabricated on top of a five-level CMOS device.

FIG. 16 is a cross-sectional view of a HEXSIL structure having silicon oxide and germanium as sacrificial layers.

Like reference symbols and reference numbers in the various drawings indicate like elements.

DETAILED DESCRIPTION

The present invention is directed to the use of a $Si_{1-x}Ge_x$, material, where $0<x\leq1$, for fabricating MEMS devices. The present invention will be described in terms of several representative embodiments and process steps in fabricating a MEMS resonator with pre-existing microelectronics.

Poly-SiGe is a semiconductor alloy material which has properties similar to Poly-Si, but can be processed at substantially lower temperatures. Table 1 provides a comparison of the various properties of poly-Si and poly-Ge.

TABLE 1

Properties of poly-Si and poly-Ge

|  | Poly-Si | Poly-Ge |
|---|---|---|
| Thermal Properties: |  |  |
| Melting temperature (° C.) | 1415 | 937 |
| $T_{deposition}$ (° C.) | ~600 | ~350 |
| $T_{stress\ anneal}$ (° C.) | 900 | <550 |
| Thermal expansion ($10^{-6}$/K) | 2.6 | 5.8 |
| Mechanical Properties: |  |  |
| Young's Modulus (Gpa) | 173 | 132 |
| Fracture strength (Gpa) | 2.6 +/− 0.3 | 2.2 +/− 0.4 |
| Electrical Properties: |  |  |
| Bandgap at 300 K (eV) | 1.12 | .66 |
| Electron affinity (V) | 4.15 | 4.00 |

FIG. 1A shows the top view of device 120 including a CMOS trans-resistance amplifier 100 and a microresonator 105 in a side-by-side configuration. The resonator 105 is a comb-drive device fabricated with microfabrication equipment using p-type $Si_{1-x}Ge_x$, where $0<x\leq1$, as the structural material and Ge as the sacrificial material. In this particular device, x=0.64. Resonator microstructures are described in U.S. Pat. Nos. 5,025,346; 5,491,604; 5,537,083; and 5,839,062. These patents are all assigned to the assignee of the present application and are incorporated herein by reference.

The amplifier 100 may include one or more transistors. The transistors may be MOS or bipolar transistors. The transistors may be formed on a silicon substrate.

FIG. 1B shows amplifier 100 and microresonator 105 in a vertical configuration on device 120. The low deposition temperature of SiGe films makes it possible to deposit the MEMS structure after completion of the microelectronics. Therefore, resonator 105 can be fabricated directly on top of amplifier 100. This vertical configuration reduces interconnect resistance and capacitance inherent in the side-by-side configuration of FIG. 1A, enhancing device performance.

Conventional low pressure chemical vapor deposition (LPCVD) equipment can be used to conformally deposit poly-SiGe films by thermal decomposition of germane ($GeH_4$) and silane ($SiH_4$) or disilane ($Si_2H_6$). Film deposition using disilane as a silicon source allows for reduced deposition temperatures, when compared with films deposition using silane. The films may be deposited at temperatures of about 650° C. or less, about 550° C. or less, or even 450° C. or less. Si deposition is catalyzed by the presence of Ge, so that the film deposition rate increases with increasing Ge content when the process is limited by surface reactions. Thus, the deposition temperature can be lowered by increasing the Ge content. Deposition rates of greater than 50 Å/minute can be achieved at temperatures below 475° C. for films with more than 50% Ge content, and at temperatures down to 325° C. for pure Ge.

The Ge content in the structural and sacrificial layers can range from about 30 to 100 percent. As discussed below, however, the Ge content in the sacrificial $Si_{(1-x)}Ge_{(x)}$ layer needs to be greater than that in the structural layer.

Poly-$Si_{1-x}Ge_x$ films can be heavily doped by the incorporation of dopants in-situ during deposition or ex-situ by ion implantation or diffusion and subsequent thermal annealing. The resistivity of p-type poly-$Si_{1-x}Ge_x$ films generally decreases with Ge content, due to increases in carrier mobility and dopant activation rate. However, the resistivity of n-type films increases with Ge content above about 40 percent, due to reductions in dopant activation rate.

Poly-$Si_{1-x}Ge_x$ films can be patterned by well-established wet-or dry-etching techniques. Germanium oxides are soluble in water; consequently, Ge-rich poly-$Si_{1-x}Ge_x$ is etched in oxidizing solutions such as $H_2O_2$. Ge is not attacked by nonoxidizing acids, such as HF, and bases. The $Si_{1-x}Ge_x$ films with greater than about 60 percent Ge content are rapidly etched in the standard RCA, SC1 clean bath (1:1:5 $NH_4OH:H_2O_2:H_2O$). This solution can thus be used to etch both doped and undoped $Si_{1-x}Ge_x$ films with a selectivity (to Si and $SiO_2$) which increases exponentially with Ge content. Poly-$Si_{1-x}Ge_x$ films are not significantly affected by mildly oxidizing or non-oxidizing solutions which are typically used in wet cleaning processes. poly-$Si_{1-x}Ge_x$ is etched in flourine-based plasmas. The plasma etch rate of poly $Si_{1-x}Ge_x$ films increases with increasing Ge content due to the greater gasification rate of Ge atoms. High $Si_{1-x}Ge_x$-to-Si etch-rate ratios can easily be achieved using reactive ion etching.

In order to maintain a low thermal budget for the MEMS fabrication process, rapid thermal annealing (RTA) by high-power tungsten-halogen lamp irradiation can be employed to lower the resistivity of the poly-$Si_{1-x}Ge_x$ films. Because Ge has a lower energy band gap than Si, it absorbs the lamp radiation much more efficiently than Si. Its higher absorption coefficient results in selective heating of Ge during the anneal. This feature can be exploited to realize higher annealing temperatures for poly-$Si_{1-x}Ge_x$ or poly-Ge microstructural films than would otherwise be possible with furnace annealing. This selective annealing phenomenon is a unique advantage of poly-$Si_{1-x}Ge_x$ or poly-Ge microstructural films in lowering the thermal budget needed for MEMS fabrication.

Referring to FIGS. 2–7, the process steps for the modular integration of mainstream microstructures, for example microresonator 105, with conventional CMOS circuitry, for example amplifier 100, are illustrated. A starting substrate 110 (FIG. 2) contains microelectronic circuitry, such as NMOS 210, fabricated using a conventional CMOS or BiCMOS transistor process. A metal interconnect 215 may be formed with Al or an alloy of Al. Alternatively, it can be formed by Cu or an alloy of Cu, or other standard metallurgy. There can be barrier metals such as Ti/TiN (not shown) between interconnect 215 and substrate 110. The interconnect 215 is connected to a heavily doped p+ type ($p^+$) polycrystalline silicon (poly-Si) strap 205.

These figures are not to scale, so that all layers are clearly visible. Several metal interconnect layers are possible, but only one is shown for simplicity. The electronics are passivated with low-temperature-deposited silicon dioxide (LTO) 225. The LTO 225 is chemo-mechanically polished to achieve a planar surface.

Referring to FIG. 3, a via 305 is cut through LTO 225 to p+ poly-Si connection strap 205 using conventional lithography and etch steps. In another embodiment, via 305 could go down to interconnect 215, eliminating the need for p+ poly-Si connection strap 205 and thus reducing interconnect resistance.

Next, a layer 310 of p+ poly-$Si_{1-x}Ge_x$, which will serve as the ground plane, is deposited and patterned. In one embodiment, an in-situ doped film is used. Alternatively, ground plane 310 can be formed by depositing an undoped film and subsequently doping it by ion implantation or diffusion processes well-known in the art. A p+ poly-$Si_{1-x}Ge_x$ material with 0.8>x>0.6 could be used for ground plane 310, as the Ge content must be high enough to enable low processing temperatures (for compatibility with metallized electronics), but cannot be so high that the ground plane would not be able to withstand the final microstructure-release etching step.

A variety of deposition and predeposition conditions are possible for this step and other steps mentioned elsewhere in this detailed description. It should be clear that the various deposition conditions are mentioned for illustrative purposes only. While there are other possible deposition conditions, the following deposition conditions for p+ poly-$Si_{1-x}Ge_x$ ground plane 310 are provided: predepositing an amorphous Si layer (not shown) of less than 5 nanometers by flowing for two minutes 200 standard cubic centimeter per minute (sccm) $Si_2H_6$ at a pressure of 300 mT and a temperature of 425° C. This is needed to allow the p+ poly-$Si_{1-x}Ge_x$ ground plane to nucleate on LTO 225. The final ground plane thickness is approximately 500 nanometers, and it is deposited by flowing for 30 minutes 85 sccm $SiH_4$, 90 sccm $GeH_4$, and 50 sccm of the B dopant source gas (10% $B_2H_6$ and 90% $SiH_4$) at 600 mT and 450° C.

FIG. 4 shows that a sacrificial layer 405 of poly-Ge is then deposited, and selectively etched down to p+ poly-$Si_{1-x}Ge_x$ ground plane 310 in region 410 where the structural layer of the microstructure is to be anchored. The location of region 410 with respect to interconnect 215 is for illustrative purpose only and can be more to the right or to the left of the interconnect. The deposition conditions for the sacrificial layer 405 are as follows: predeposition: 5 min., 300 mT, 375° C., 200 sccm $Si_2H_6$; and deposition: 165 min., 300 mT, 375° C., 220 sccm $GeH_4$.

These deposition conditions resulted in a 2.7 micron thick sacrificial layer 405. Again, the predeposition is needed for the poly-Ge to be able to deposit on LTO 225. It is possible to have poly-Si$_{1-x}$Ge$_x$ instead of poly-Ge as the sacrificial material for layer 405. However, the sacrificial poly-Si$_{1-x}$Ge$_x$ must have an x greater than the x for the structural poly-Si$_{1-x}$Ge$_x$; that is, the sacrificial material must have a higher Ge content than the structural layers. This is because the material with higher Ge content will be etched (sacrificed) faster in oxidizing solutions than the material with lower Ge content.

Next, in FIG. 5, a structural layer 505 of p+ poly-Si$_{1-x}$Ge$_x$ is deposited and patterned. The deposition conditions for the layer 505 of p+ poly-Si$_{1-x}$Ge$_x$ are as follows: predeposition: 2 min., 300 mT, 425° C., 200 sccm Si$_2$H$_6$; and deposition: 180 min., 600 mT, 450° C., 85 sccm SiH$_4$, 90 sccm GeH$_4$, and 50 sccm of the B dopant source gas (10% B$_2$H$_6$ and 90% SiH$_4$).

The deposited structural layer 505 is a 3 micron thick film. Again the predeposition allows structural layer 505 to form on SiO$_2$. Although there should not have been any SiO$_2$ surfaces, poly-Si$_{1-x}$Ge$_x$ can form a thin native oxide layer (not shown).

Referring to FIG. 6, opening 610 is then patterned and etched through sacrificial poly-Ge layer 405, ground-plane 310 and layer 225. This step exposes a metal bond pad 605. The standard release etchant used in conventional surface-micromachining technology is a hydrofluoric acid (HF) solution, which attacks metal and hence makes it difficult to clear bond-pad areas prior to microstructure release. The use of germanium as a sacrificial material makes it possible to expose the metal bond pad without risking any damage, since germanium is easily removed in an oxidizing solution which is benign to metal. This simplifies and improves the reliability of the packaging process.

In FIG. 7, sacrificial poly-Ge layer 405 is then etched away using an oxidizing solution such as H$_2$O$_2$. Finally, substrate 110 is rinsed and dried. Precautions to prevent stiction between structural layer 505 and ground plane 310 may be necessary. Note that this process allows MEMS structures to be fabricated directly on top of the electronics as depicted in FIGS. 1B and 7. This reduces parasitic resistances and capacitances associated with long interconnects, and also reduces cost by saving area.

This process flow is directly applicable to fabricating MEMS structures over standard electronic circuitry in which a p-type poly-Si layer is available to form interconnections between devices. It should be noted that sub-0.25 micron CMOS technology typically employs a poly-Si layer which is selectively doped (n+ in n-channel device regions, p+ in p-channel device regions), so that p+ poly-Si would be readily available for forming interconnecting straps between the MEMS and CMOS devices. Alternatively, the p+ poly-Si$_{1-x}$Ge$_x$ ground plane could be connected directly to a metal line, without the need for an intermediary poly-Si strap.

Although the use of Ge-rich poly-SiGe as a sacrificial layer has several advantages, the MEMS-last integration strategy is also feasible using oxide sacrificial layers. In this case, it is possible to use n-type or p-type poly-Si$_{1-x}$Ge$_x$ as the structural layer. Since HF is the release etchant for oxide sacrificial layers, it is necessary to protect the electronic structures from attack by HF during release. A pinhole-free layer is needed that can be deposited at low temperatures (<450° C.) and that can withstand lengthy exposure to HF without degradation. Furthermore, the film cannot be highly conductive, or it will short out the poly-Si$_{1-x}$Ge$_x$ microstructures. Amorphous silicon is found to be a useful film for this application.

FIGS. 8–13 illustrate an alternative process of manufacturing a MEMS device, such as microresonator 105, directly on top of microelectronics, such as amplifier 100, using oxide as the sacrificial material. In FIG. 8, a starting substrate 112 contains microelectronic circuitry, such as NMOS 212, fabricated using a conventional CMOS or BiCMOS transistor process. A metal interconnect 217 may be formed with Al, Cu, an alloy of Al, an alloy of Cu, or other standard metallurgy. Here interconnect 217 is made of Al. There can be barrier metals such as Ti/TiN (not shown) between interconnect 217 and substrate 112. In this embodiment, a strap 805 connected to interconnect 217 is a heavily doped n-type (n+) polycrystalline silicon (poly-Si) material.

These figures are not to scale, so that all layers are clearly visible. Several metal interconnect layers are possible, but only one is shown for simplicity. The electronics are passivated with low-temperature-deposited silicon dioxide (LTO) 227.

As shown in FIG. 9, an amorphous Si (α-Si) layer 905 is then deposited. This α-Si is resistant to hydrofluoric acid (HF) and was demonstrated to protect the electronics, such as NMOS 212, from HP. Another LTO layer 910 is subsequently deposited to serve as an etch-stop layer for a later etch step. This LTO layer 910 can be eliminated in other embodiments.

The deposition conditions for a 590 Å thick layer 905 include a two-step LPCVD process for flowing Si$_2$H$_6$ at 500 mT. Step 1 is conducted at 450° C. for 6 minutes, and step 2 is conducted at 410° C. for 40 minutes In FIG. 10, via 1000 is then formed through multilayer stack layers 227, 905 and 910 using conventional lithography and etch steps. The via 1000 goes down to an n+ poly-Si connection strap 805. In other embodiments, the via(s) could go down to interconnect 217 instead and n+ poly-Si connection strap 805 could be eliminated, reducing interconnect resistance.

Next, an n+ poly-Ge layer 1010 is deposited. This n+ poly-Ge layer is the ground-plane layer. Although an in-situ doped film was used, ground-plane layer 1010 can be formed by depositing an undoped film and subsequently doping it by ion implantation or diffusion processes well-known in the art. It should be noted that instead of n+ or p+ poly-Ge, n+ or p+ poly-Si$_{1-x}$Ge$_x$ with x<1 could be employed for the ground-plane layer. The ground plane layer is patterned using conventional lithography and etch processes.

The deposition conditions for a 3100 Å thick n+ poly-Ge ground plane layer 1010 include a LPCVD process conducted at 400° C. and 300 mT: predeposition: 200 sccm Si$_2$H$_6$ for 1 minute; and deposition: 100 sccm GeH$_4$ and 10 sccm 50% PH$_3$/50% SiH$_4$ for 50 minutes.

Next, as shown in FIG. 11, a sacrificial layer 1100 of LTO is deposited. The LTO layer 1100 is chemo-mechanically polished to give a flat surface. The LTO layer 1100 is then etched down to the n+ poly-Ge ground plane in region 1110 where the structural layer is to be anchored (e.g. on the right side of the figure) and connected to ground plane 1010.

As illustrated in FIG. 12, a structural layer of n+ poly-Ge 1200 is next deposited. Although an in-situ doped film can be used, structural layer 1200 can be formed by depositing an undoped film and subsequently doping it by ion implantation or diffusion as is well-known in the art. Again, it should be noted that instead of n+ or p+ poly-Ge, n+ or p+ poly-Si$_{1-x}$Ge$_x$ with x<1 could be employed for structural layer 1200. The structural layer 1200 is patterned using conventional lithography and etch processes.

The deposition conditions for forming a 2.2 micron thick n+ poly-Ge structural layer 1200 include a LPCVD process conducted at 400° C., 300 mT: predeposition: 200 sccm $Si_2H_6$ for 1 minute; and deposition: 100 sccm $GeH_4$ and 10 sccm 50% $PH_3$/50% $SiH_4$ for 4 hours and 45 minutes.

Referring to FIG. 13, the devices are next annealed with RTA of 550° C. for 30 seconds in a nitrogen ($N_2$) environment to lower the resistance of n+ poly-Ge layer 1200. The sacrificial LTO 1100 is then etched away using an HF-containing solution. Finally, substrate 112 is rinsed with water and then methanol, and air-dried. Typically, stiction between structural layer 1200 and ground plane layer 1010 occurs during the drying process, and extra steps are needed to avoid this problem. It is found that poly-Ge structural layer 1200 does not stick down to poly-Ge ground plane layer 1010. This advantageous low stiction property of poly-Ge may also exist for poly-$Si_{1-x}Ge_x$ with x<1. Note that this process allows the MEMS structures to be fabricated directly on top of the electronics as depicted in FIG. 13. This reduces parasitic resistances and capacitances associated with long interconnects, and also reduces cost by saving area.

This process flow is directly applicable to fabricating MEMS structures over standard electronic circuitry in which an n+ poly-Si layer is available to form interconnections between devices. It is also possible to use heavily doped p-type (p+) poly-$Si_{1-x}Ge_x$ for the structural layer(s). If so, either a p+ poly-Si interconnection strap could be used, or the p+ poly-$Si_{1-x}Ge_x$ ground plane could be connected directly to a metal line, without the need for an intermediary poly-Si strap.

As a variation of the above processes, the transistors on the substrate may be formed without metallization before the sacrificial and structural layers for the microstructure are formed. The transistors may then be metallized after the sacrificial and structural layers are formed. However, this interleaved fabrication strategy does not have the manufacturing advantages of the post-electronics modular approachs described in FIGS. 2–13.

The frequency response of an integrated poly-Ge resonator and standard CMOS amplifier is displayed in FIG. 14. The ground plane and shuttle were biased at 50 V. The drive signal was an AC signal with $7V_{p-p}$. The device was tested in air and the resonator had a Q of 45 and a resonant frequency of 14.05 kHz. The frequency response shows that the device was fully functional.

While single layer interconnect layers are shown in the processes of FIGS. 2–7 and FIGS. 8–13, FIG. 15 illustrates that the several metal interconnect layers that are available in a modern CMOS device enable the design of short, well-shielded vertical interconnections between a MEMS structure and the electronics. The MEMS structure 1500, such as a microresonator, is fabricated directly on a 5-level metal interconnect 1550. As shown, the microresonator includes drive electrodes 1505, a tuning fork resonator 1510, and sense electrodes 1515. The 5-level metal interconnect 1550 includes a DC bias 1520 to resonator 1510, and shields 1525 and 1530 to protect interconnect 1555 to drive electrodes 1505. The interconnect 1550 also includes shields 1540 and 1535 to protect interconnect 1545 to sense electrodes 1515. The integrated MEMS 1500 is inexpensive to fabricate, since there is no need for a specialized, expensive electronics process and since the addition of the MEMS structure does not increase the die size. Finally, the extension to multiple structural layers is much easier than for MEMS-first integration strategies because the increase in thickness of the MEMS film stack has no impact on the electronics process.

The availability of several sacrificial materials ($SiO_2$, Ge-rich SiGe, and Si-rich SiGe) provides different design options for other devices, such as a HEXSIL structure of the type disclosed in U.S. Pat. No. 5,660,680, assigned to the assignee as the subject application and which is incorporated herein by reference. As shown in FIG. 16, a HEXSIL structure 1615 of SiGe is formed in a Si mold 1620 using two sacrificial layers, an $SiO_2$ layer 1610 and a Ge layer 1605. The ability to etch different sacrificial layers at different times during a process offers various design options. For example, the thermal coefficient of expansion of $SiO_2$ layer 1610 is sufficiently different from that of Si mold 1620 so that cracks can result from cooling the mold after deposition. An HF etchant could also damage the mold with repeated use. Layers of Ge-rich SiGe and $SiO_2$ could be used to make the thermal expansion coefficient of the sacrificial material match that of the Si mold. Also an $H_2O_2$:$NH_4OH$:$H_2O$, 1:1:5 solution bubbles at about 70° C. which eases release of the molded structure from mold 1620. This solution would also not damage the mold.

Additionally, SiGe has unique properties that will allow the design of new devices. Unlike Si, Ge is reflective at the infrared wavelengths of interest for communication applications. The reflectivity of Ge is higher at wavelengths in the infrared and visible regimes. Optical switches and projection television applications may be able to use Ge reflectors without coatings to improve reflectivity. Such devices may be fabricated on glass substrates. The low processing temperatures for SiGe will allow the use of low temperature materials. Relatively thick layers can be fabricated with less concern for wafer bow during processing. By grading the Ge concentration, three-dimensional sculpting of layered structures will be possible. The stress, Young's Modulus, density, and conductivity can be tailored by changing the Ge concentration.

A number of embodiments of the invention have been described. Nevertheless, it will be understood that various modifications may be made without departing from the spirit and scope of the invention. Accordingly, other embodiments are within the scope of the following claims.

What is claimed is:

1. A micro-electromechanical system, comprising:
   a substrate;
   one or more structural layers of $Si_{1-x}Ge_x$, deposited on the substrate, where $0<x\leq1$; and
   one or more transistors formed on the substrate.

2. The micro-electromechanical system of claim 1, wherein the substrate is a silicon substrate.

3. The micro-electromechanical system of claim 1, wherein the substrate is a glass substrate.

4. The micro-electromechanical system of claim 1, further comprising at least portions of one or more sacrificial layers of silicon oxide formed under respective structural layers.

5. The micro-electromechanical system of claim 1, wherein the one or more transistors are MOS transistors.

6. The micro-electromechanical system of claim 1, wherein the one or more transistors are bipolar transistors.

7. The micro-electromechanical system of claim 1, incorporated into an optical device.

8. The micro-electromechanical system of claim 1, wherein the one or more structural layers form a resonator.

9. A micro-electromechanical system, comprising:
   a substrate;
   one or more structural layers of $Si_{1-x}Ge_x$, formed on the substrate, where $0<x\leq1$;
   at least portions of one or more sacrificial layers of silicon-germanium formed under the respective structural layers, where the germanium content of the one or more sacrificial layers is greater than the germanium content of the respective structural layers; and one or more transistors formed on the substrate.

10. A micro-electromechanical system, comprising:

a substrate;

one or more structural layers of $Si_{1-x}Ge_x$, formed on the substrate, where $0<x\leqq1$ and wherein the germanium concentration of at least one structural layer varies through its depth; and one or more transistors formed on the substrate.

11. The micro-electromechanical system of claim 10, wherein the at least one structural layer has a desired three-dimensional shape.

12. A micro-electromechanical system, comprising:

a substrate;

one or more transistors formed on the substrate; and one or more structural layers of $Si_{1-x}Ge_x$, deposited onto an upper level of a metal interconnect of the one or more transistors, where $0<x\leqq1$.

13. The micro-electromechanical system of claim 12, wherein the one or more structural layers form a ground plane which is electrically connected to the upper level of the metal interconnect.

* * * * *